United States Patent
Tung

(12) 
(10) Patent No.: US 6,316,299 B1
(45) Date of Patent: Nov. 13, 2001

(54) FORMATION OF LATERALLY DIFFUSED METAL-OXIDE SEMICONDUCTOR DEVICE

(75) Inventor: Ming-Tsung Tung, Hsin-Chu Hsian (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/262,188

(22) Filed: Mar. 4, 1999

(51) Int. Cl.[7] .................................... H01L 21/336
(52) U.S. Cl. ............................. 438/197; 438/589
(58) Field of Search ................... 438/197, 589, 438/FOR 192, FOR 197, FOR 363

(56) References Cited

U.S. PATENT DOCUMENTS

| | | | |
|---|---|---|---|
| 4,767,722 | * | 8/1988 | Blanchard . |
| 5,071,782 | * | 12/1991 | Mori . |
| 5,387,528 | * | 2/1995 | Hutchings et al. . |
| 5,915,180 | * | 6/1999 | Hara et al. . |
| 6,069,043 | * | 5/2000 | Floyd et al. . |
| 6,100,140 | * | 8/2000 | Okabe et al. . |
| 6,117,712 | * | 9/2000 | Wu . |
| 6,133,099 | * | 10/2000 | Sawada . |

* cited by examiner

*Primary Examiner*—George Fourson
*Assistant Examiner*—Joannie A. Garcia

(57) ABSTRACT

The method of the present invention comprises the following steps. First, a silicon oxide layer is formed on a semiconductor substrate. Then, a first doping N-well region is formed in the semiconductor substrate. Next, a second doping N-well region which overlies the first doping N-well region is formed in the semiconductor substrate. Thereafter, a trench isolation is formed into the semiconductor substrate having a depth less than the depth of the first doping N-well region. Then, the silicon oxide layer is removed. Next, a field oxide is grown on the surface at a bottom of the trench. Then, a third N doping region is formed along the entire surface of the pad oxide layer within the trench. Next, the field oxide layer is removed to expose the semiconductor substrate within the trench. Thereafter, a gate oxide layer is formed onto the surface of a semiconductor layer with the trench. Next, an N-type polysilicon layer is formed to fill the trench. Last, an N[+] source/drain layer is formed which is located above the second doping N-well region and under the top surface of the semiconductor substrate in order to complete the laterally diffused metal-oxide semiconductor structure.

18 Claims, 5 Drawing Sheets

FORMATION OF LATERALLY DIFFUSED METAL-OXIDE SEMICONDUCTOR DEVICE

BACKGROUND OF THE INVENTION

1. Field of the Invention

An integrated circuit Laterally Diffused Metal-Oxide Semiconductor (LDMOS) power transistor employs a source isolated, embedded gate Metal-Oxide Semiconductor transistor with laterally diffused technology to provide a source isolated high voltage power transistor in applications requiring electrical isolation between the source and substrate.

2. Description of the Prior Art

In the field of power integrated circuits much work has been done in the development of power transistors. Advancements were made enabling Laterally Diffused Metal-Oxide Semiconductor (LDMOS) power transistors to exhibit low "on-resistance" and high breakdown capability concurrently through a reduced horizontal-surface field technique.

In the past, LDMOS transistors commonly were used in low side driver applications because the transistor's structure is coupled with the source to the substrate that in turn was coupled to the ground. Although low side driving configuration consists of the source of LDMOS transistor coupled to ground and the drain coupled to an output load. Therefore, LDMOS transistors were not utilized in high side driver applications and other applications that mandated electrical isolation between the source and substrate. (A high side driver configuration consists of the LDMOS transistor drain coupled to circuitry or a power supply and the source coupled to an output load.)

SUMMARY OF THE INVENTION

In accordance with the present invention, a method is provided for forming Laterally Diffused Metal-Oxide Semiconductor (LDMOS) that substantially can employ a source isolated high voltage power transistor in applications requiring electrical isolation between the source and substrate.

The present invention for forming a Laterally Diffused Metal-Oxide Semiconductor structure comprises the following steps. First, a silicon oxide layer is formed on a semiconductor substrate. Then, a first doping N-well region is formed in the semiconductor substrate. Next, a second doping N-well region which overlies the first doping N-well region is formed in the semiconductor substrate. Thereafter, a trench isolation is formed into the semiconductor substrate having a depth less than the depth of the first doping N-well region. Then, the silicon oxide layer is removed. Next, a field oxide is grown on the surface at the bottom of the trench. Then, a third N doping region is formed along the entire surface of the pad oxide layer within the trench. Next, the field oxide layer is removed to expose the semiconductor substrate within the trench. Thereafter, a gate oxide layer is formed on the surface of a semiconductor layer with the trench. Next, an N-type polysilicon layer is formed to fill the trench. Last, an N$^+$ source/drain layer is formed which is located above the second doping N-well region and under the top surface of the semiconductor substrate in order to complete the laterally diffused metal-oxide semiconductor structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure. Thus, it is not intended that the semiconductor devices of the present invention be limited to the structures illustrated. These devices are included to demonstrate the utility and application of the present invention to presently preferred embodiments.

FIGS. 1A to 1M are sectional views showing in combination a first embodiment of the process for producing a memory cell having lightly doped source/drain according to the present invention. In order to simplify the description of each of the embodiment, it is assumed that LDMOS (Laterally Diffused Metal-Oxide Semiconductor) which serves as switching transistors have already been prepared by a known process, and only the process for producing a stacked capacitor will be described below.

Figure 1A:
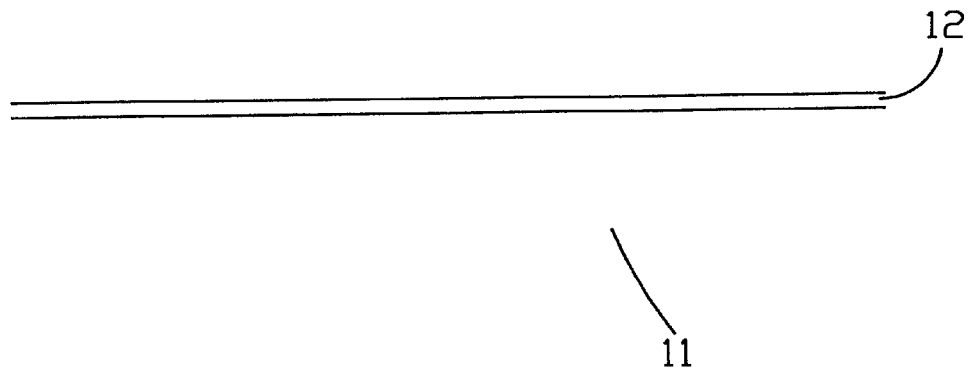
FIGS. 1A to 1M are sectional views showing in combination an embodiment of the present invention.
Figure 1B:
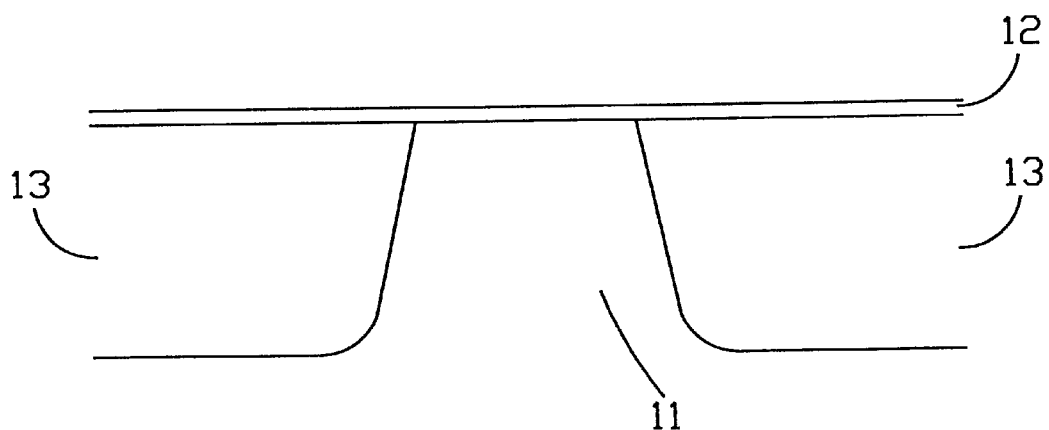

Referring to FIG. 1A, a silicon oxide layer 12 is formed on a semiconductor substrate 11 by using a thermal oxidation method. This depth of the silicon oxide layer 12 is about 1000 angstroms to 3000 angstroms. Referring to FIG. 1B, after a photolithography process is used to define a first N-well mask, a first doping N-well region 13 is formed in the semiconductor substrate 11 by using an implanting method. The final doping parameter for the implanting process is about 3E15 to 2E16 l/cm$^3$. Then, the first doping N-well region 13 is driven into the semiconductor substrate by a thermal diffusion method.

Figure 1C:
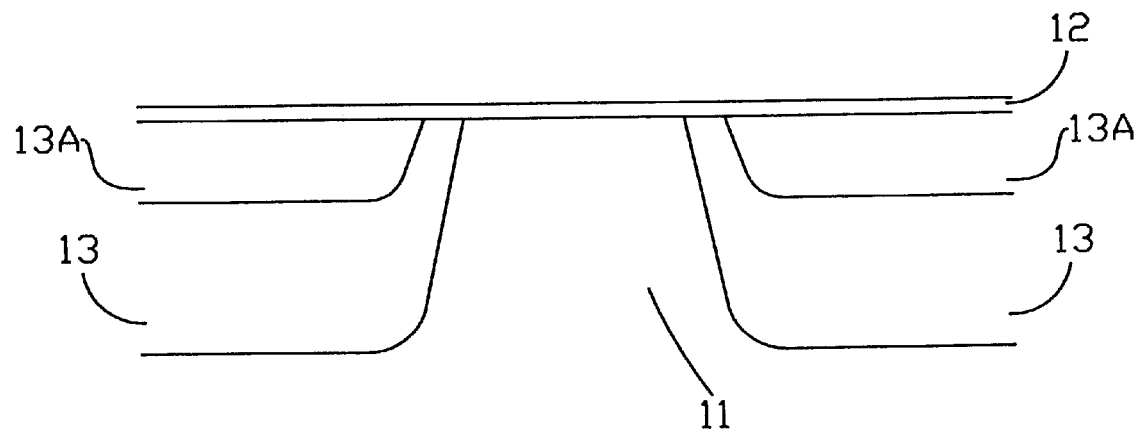

Referring to FIG. 1C, after a photolithography process is used to define a second N-well mask, a second doping N-well region 13A is formed in the semiconductor substrate 11 by using an implanting method. The second doping N-well region 13A is located in the semiconductor substrate 11 and overlies the first doping N-well region 13. Then, the second doping N-well region 13A is also driven into the semiconductor substrate 11 by a thermal diffusion method. Its final doping parameter for the implanting process is about 8E15 to 2E16 l/cm$^3$.

Figure 1D:
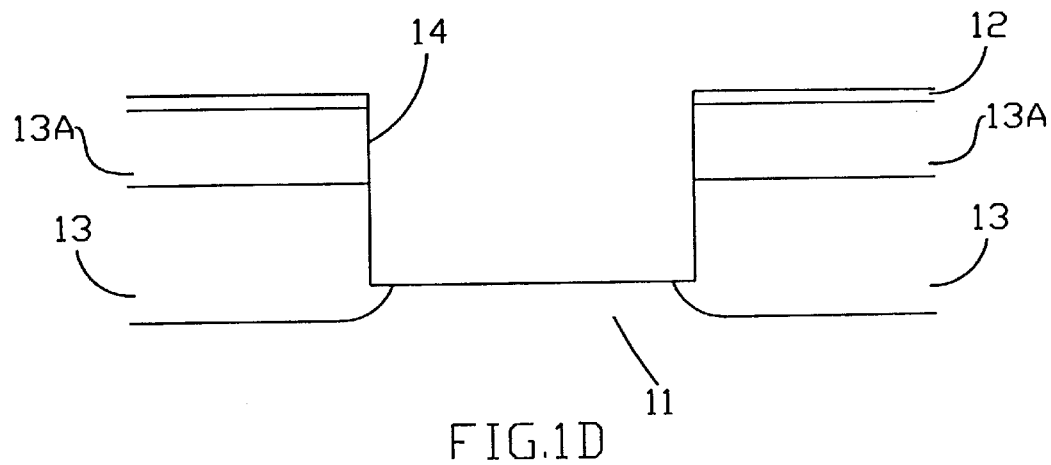
Figure 1E:
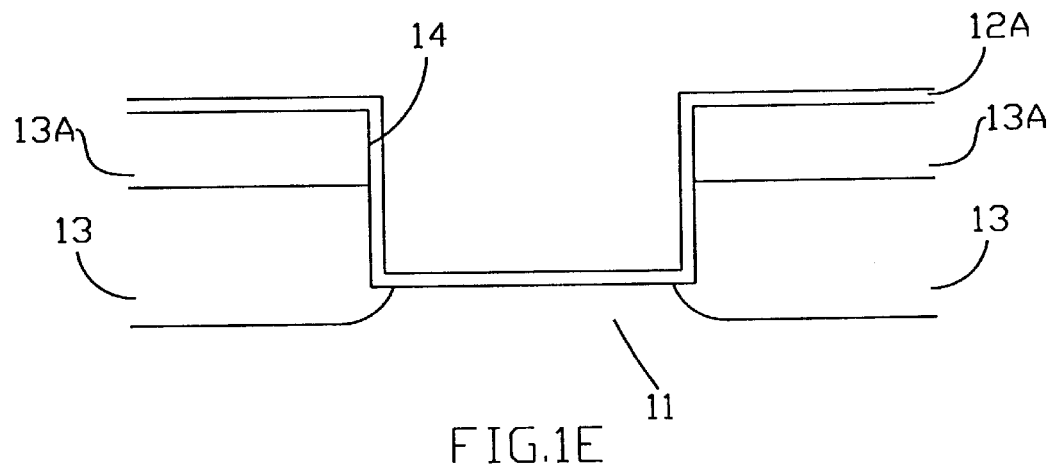
Figure 1F:
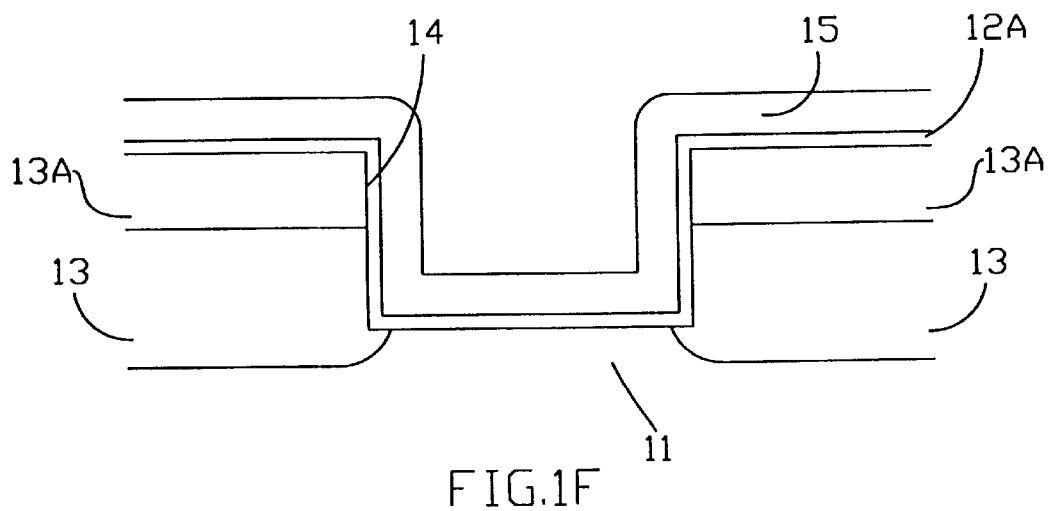

Referring to FIG. 1D, a trench 14 is formed using a conventional trench non-isotropic etching method. The trench 14 has a depth which is less than the depth of the first doping N-well region 13. Particularly, a trench isolation method is employed by a processing method which enables completely non-isotropic etching. Then, a pad oxide layer 12A is formed on the top surface of the semiconductor substrate 11 and on the trench 14 using a thermal oxidation method after removing the silicon oxide layer 12, as in FIG. 1E. Also, the depth of the pad oxide layer 12A is about 100 angstroms to 200 angstroms. Referring to FIG. 1F, next, a nitride layer 15, such as a silicon nitride layer, is formed on the pad oxide layer 12A using a Low Pressure Chemical Vapor Deposition (LPCVD) method. The depth of the silicon nitride layer 15 is about 100 angstroms to 300 angstroms.

Figure 1G:
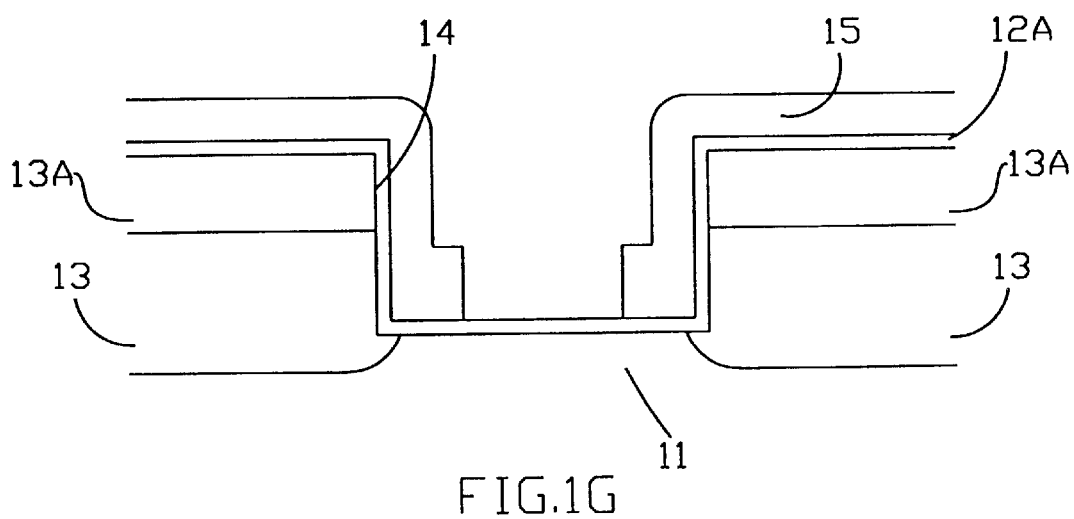
Figure 1H:
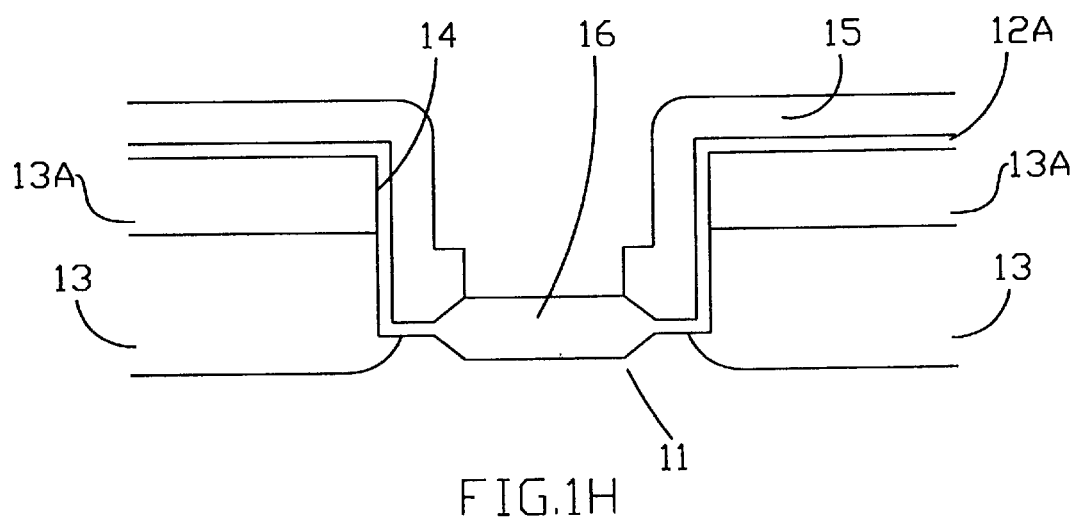

Referring to FIG. 1G, the silicon nitride layer 15 is etched to have an opening therein. The opening exposes the pad oxide layer 12A at a bottom of the trench 14. Referring to FIG. 1H, after this step, a field oxide 16 is grown onto the exposed surface of the pad oxide layer 12A. Also, the width of the field oxide 16 is about 3000 angstroms to 10000 angstroms.

Figure 1I:
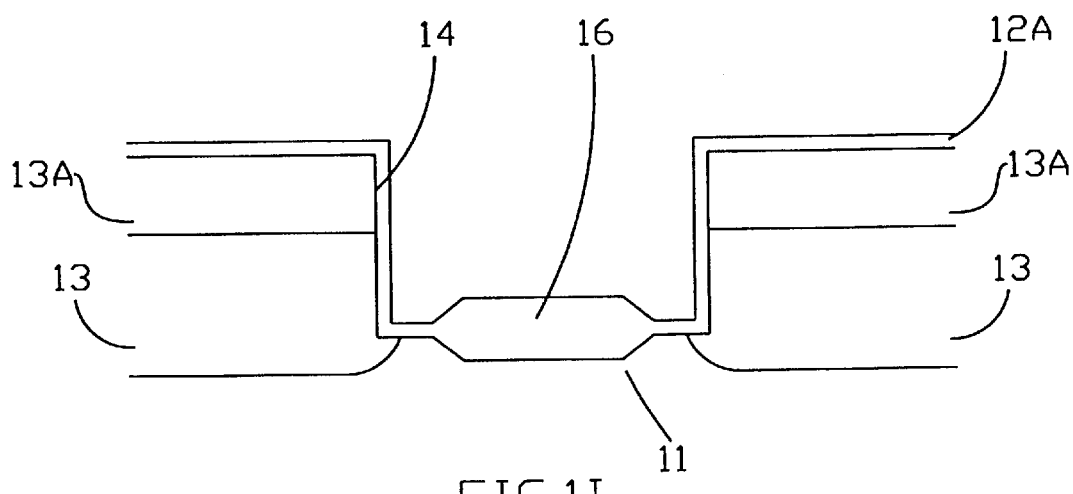
Figure 1J:
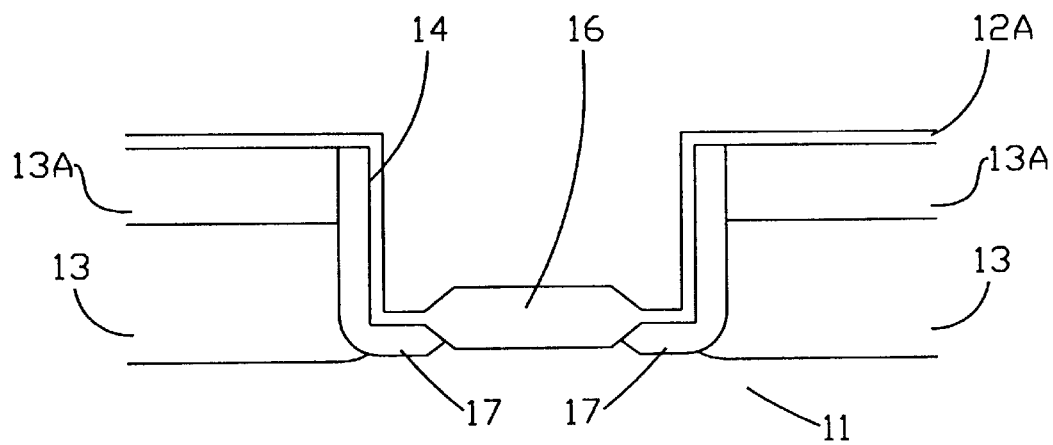

Referring to FIG. 1I, the silicon nitride layer 15 is then removed. Consequently, as illustrated in FIG. 1J, a first N doping region 17 is formed along the entire surface of the pad oxide layer 12A with the trench 14 using a photolithography method and then a self-aligned method. Also, an implanting method is carried out after the above methods are completed. Particularly the doping parameter for the implanting process is about 8E15 to 1E17 l/cm$^3$. Meanwhile, a conventional annealing method is achieved as well for the implanting process.

Figure 1K:
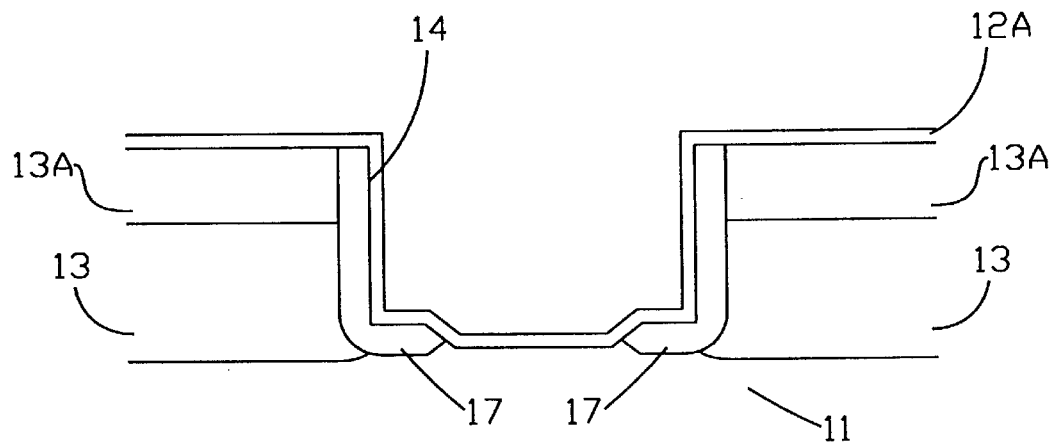
Figure 1L:
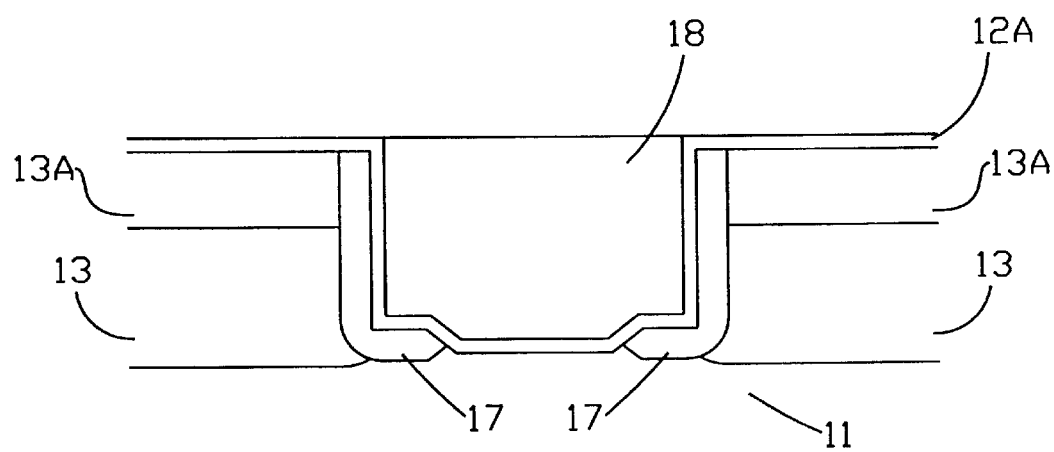

Referring to FIG. 1K, the pad oxide layer 12A and the field oxide 16 are all removed. Then, a gate oxide layer 12B is formed on the top surface of the semiconductor substrate 11 and on the trench 14 surface by using a LPCVD method or thermal diffusion. Here, the depth of the gate oxide layer 12B is about 300 angstroms to 1000 angstroms. Consequentially, referring to FIG. 1L, a polysilicon layer is formed to fill the trench 14 using a photolithography method which includes an etching process. Then, an N$^+$-type polysilicon layer 18 is formed by implanting into the polysilicon layer and the N$^+$-type polysilicon layer 18 is used as a gate electrode in this device.

Figure 1M:
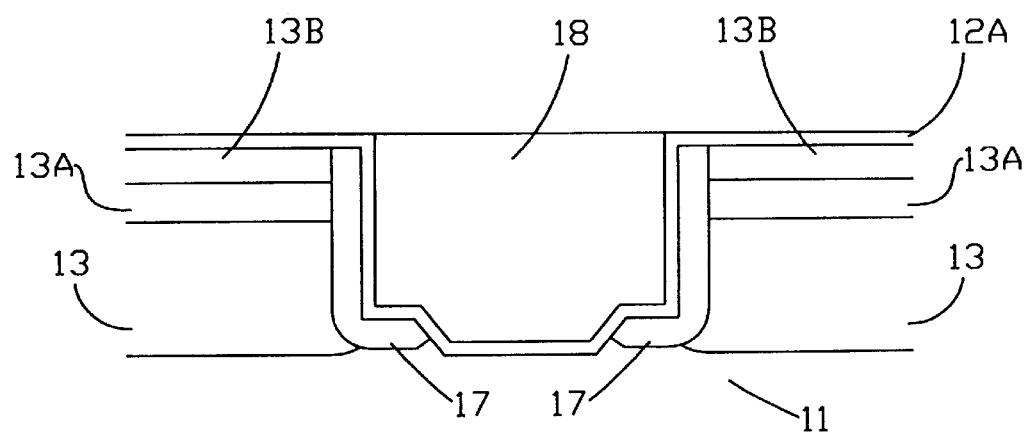

Referring to FIG. 1M, last, an N$^+$ source/drain layer 13B is formed in the semiconductor substrate 11 to complete the laterally diffused metal-oxide semiconductor structure. The N$^+$-type source/drain layer 13B of the transistor will be formed entirely using an implanting method and a general annealing method. Hence, the N$^+$ source/drain region layer 13B overlies the second doping N-well region 13A and under the top surface of the semiconductor substrate 11.

Although specific embodiments have been illustrated and described, it will be obvious to those skilled in the art that various modifications may be made without departing from what is intended to be limited solely by the appended claims.

What is claimed is:

1. A method for forming a Laterally Diffused Metal-Oxide Semiconductor structure, comprising:

providing a semiconductor substrate having a silicon oxide layer thereon;

implanting to form a first doping N-well region in the semiconductor substrate;

implanting to form a second doping N-well region which overlies the first doping N-well region in the semiconductor substrate;

forming a trench isolation to a depth less than the depth of the first doping N-well region into the semiconductor substrate;

removing the silicon oxide layer;

forming a pad oxide layer on the top surface of the semiconductor substrate and on the trench surfaces;

depositing a silicon nitride layer on the pad oxide layer;

etching the silicon nitride layer to have an opening therein which exposes the pad oxide layer at a bottom of the trench;

growing a field oxide onto the exposed surface of the pad oxide layer;

removing the silicon nitride layers;

implanting to form a third N doping region which is formed along the entire surface of the pad oxide layer within the trench, removing the pad oxide layer and the field oxide layer to expose the semiconductor substrate within the trench;

forming a gate oxide layer onto the surface of a semiconductor layer with the trench;

forming a polysilicon layer in the trench and implanting into the polysilicon layer to form an N-type polysilicon layer, and implanting to form an N$^+$ source/drain layer which is located above the second doping N-well region and under the top surface of the semiconductor substrate in order to complete the laterally diffused meral-oxide semiconductor structure.

2. The method according to claim 1, wherein the depth of the pad oxide layer is about 100 angstroms to 200 angstroms.

3. The method according to claim 1, wherein the silicon nitride layer is formed by using LPCVD (Low Pressure Chemical Vapor Deposition).

4. The method according to claim 1, wherein the depth of the silicon nitride layer is about 100 angstroms to 300 angstroms.

5. The method according to claim 1, wherein The width of the pad oxide layer is about 3000 angstroms to 10000 angstroms.

6. The method according to claim 1, wherein the third N doping region is formed using a photolithography method and then a self-aligned method.

7. The method according to claim 1, wherein the parameter for implanting the third N doping region is about 8E15 to 1E17 l/cm$^3$.

8. The method according to claim 1, wherein forming a gate oxide to the surface of the semiconductor layer is effected using LPCVD.

9. The method according to claim 1, wherein forming a gate oxide the top surface of the semiconductor layer is effected using thermal diffusion.

10. A method for forming a Laterally Diffused Metal-Oxide Semiconductor structure comprising:

providing a semiconductor substrate;

forming a silicon oxide layer on the semiconductor substrate;

implanting to form a first doping N-well region in the semiconductor substrate, annealing the first doping N-well region;

implanting to form a second doping N-well region which overlies the first doping N-well region in the semiconductor substrate;

annealing the second doping N-well region;

forming a trench isolation to a depth less than the depth of the first doping N-well region into the semiconductor substrate;

removing the silicon oxide layers;

forming a pad oxide layer on the top surface of the semiconductor substrate and on the trench surfaces;

depositing a silicon nitride layer on the pad oxide layer, etching the silicon nitride layer to have an opening therein which exposes the pad oxide layer at a bottom of the trench;

growing a field oxide onto the surface of the pad oxide layer, removing the silicon nitride layer;

implanting to form a third N doping region which is formed along the entire surface of the pad oxide layer within the trench;

removing the pad oxide layer and the field oxide layer to expose the semiconductor subsrate within the trench;

forming a gate oxide layer onto the surface of a semiconductor layer within the trench;

forming a polysilicon layer in the trench and implanting into the polysilicon layer to form an N-type polysilicon layer, implanting to form an $N^+$ source/drain layer which is located above the second doping N-well region and under the top surface of the semiconductor substrate; and annealing the $N^+$ source/drain layer in order to complete the laterally diffused metal-oxide semiconductor structure.

11. The method according to claim 10, wherein the depth of the pad oxide layer is about 100 angstroms to 200 angstroms.

12. The method according to claim 10, wherein the silicon nitride layer is formed by using LPCVD (Low Pressure Chemical Vapor Deposition).

13. The method according to claim 10, wherein the depth of the silicon nitride layer is about 100 angstroms to 300 angstroms.

14. The method according to claim 10, wherein the width of the pad oxide layer is about 3000 angstroms to 10000 angstroms.

15. The method according to claim 10, wherein the third N doping region is formed using a photolithography method and then a self-aligned method.

16. The method according to claim 10, wherein the parameter for implanting the third N doping region is about 8E15 to 1E17 $l/cm^3$.

17. The method according to claim 10, wherein forming a gate oxide layer onto the surface of the semiconductor layer is effected using LPCVD.

18. The method according to claim 10, wherein forming a gate oxide layer on the top surface of the semiconductor layer is effected using thermal diffusion.

* * * * *